(12) United States Patent
Terashima et al.

(10) Patent No.: US 6,661,294 B2
(45) Date of Patent: Dec. 9, 2003

(54) PHASE-LOCKED LOOP CIRCUIT

(75) Inventors: Hisae Terashima, Tokyo (JP); Hiroyuki Ueda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/122,307

(22) Filed: Apr. 16, 2002

(65) Prior Publication Data

US 2003/0062957 A1 Apr. 3, 2003

(30) Foreign Application Priority Data

Oct. 3, 2001 (JP) ........................................ 2001-307767

(51) Int. Cl.$^7$ ................................................. H03L 7/00
(52) U.S. Cl. ........................................... 331/17; 331/1 A
(58) Field of Search ................................. 331/17, 11, 14, 331/25, 1 A, 16

(56) References Cited

U.S. PATENT DOCUMENTS

| | | | | |
|---|---|---|---|---|
| 5,334,952 A | * | 8/1994 | Maddy et al. | 331/1 A |
| 5,373,255 A | * | 12/1994 | Bray et al. | 331/1 A |
| 5,546,052 A | * | 8/1996 | Austin et al. | 331/1 A |
| 5,563,552 A | * | 10/1996 | Gersbach et al. | 331/1 A |
| 5,574,406 A | * | 11/1996 | Sauer et al. | 331/11 |
| 5,896,067 A | * | 4/1999 | Williams | 331/17 |
| 6,300,838 B1 | * | 10/2001 | Kelkar | 331/17 |

FOREIGN PATENT DOCUMENTS

JP          7-273648          10/1995

* cited by examiner

*Primary Examiner*—Robert Pascal
*Assistant Examiner*—Joseph Chang
(74) *Attorney, Agent, or Firm*—Oblon, Spivak, McClelland, Maier & Neustadt, P.C.

(57) ABSTRACT

A phase error signal indicating a most recent phase difference between an input clock signal and a feed-back signal is produced in a phase comparing unit. Also, the phase difference of the phase error signal is monitored in an abnormal condition detecting unit. When the phase difference is higher than a threshold value, the abnormal condition detecting unit judges that the input clock signal is set in an abnormal condition, and a frequency-controlled clock signal is produced in the voltage controlled oscillator according to the phase error signal. Therefore, the oscillation clock signal can be output without changing a phase of the oscillation clock signal while suppressing wonders or jitters.

11 Claims, 13 Drawing Sheets

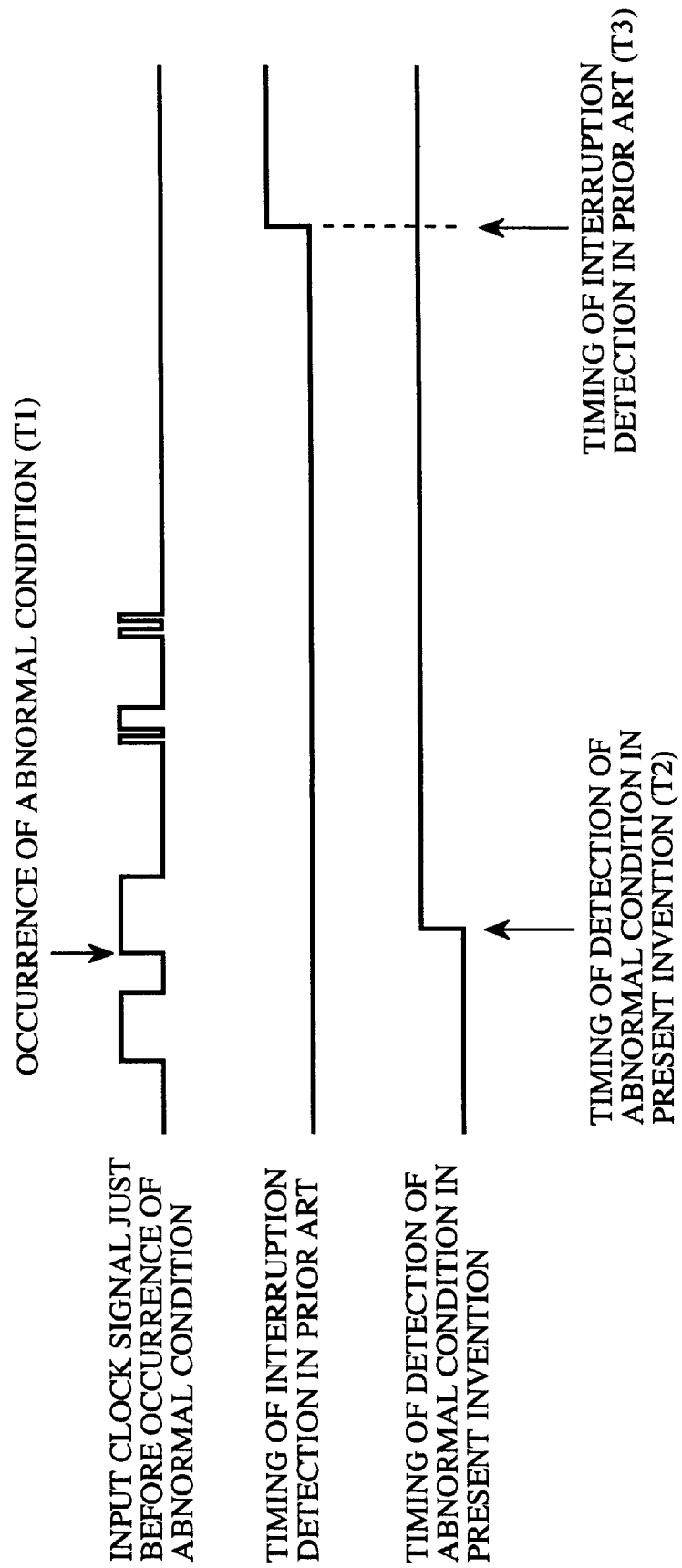

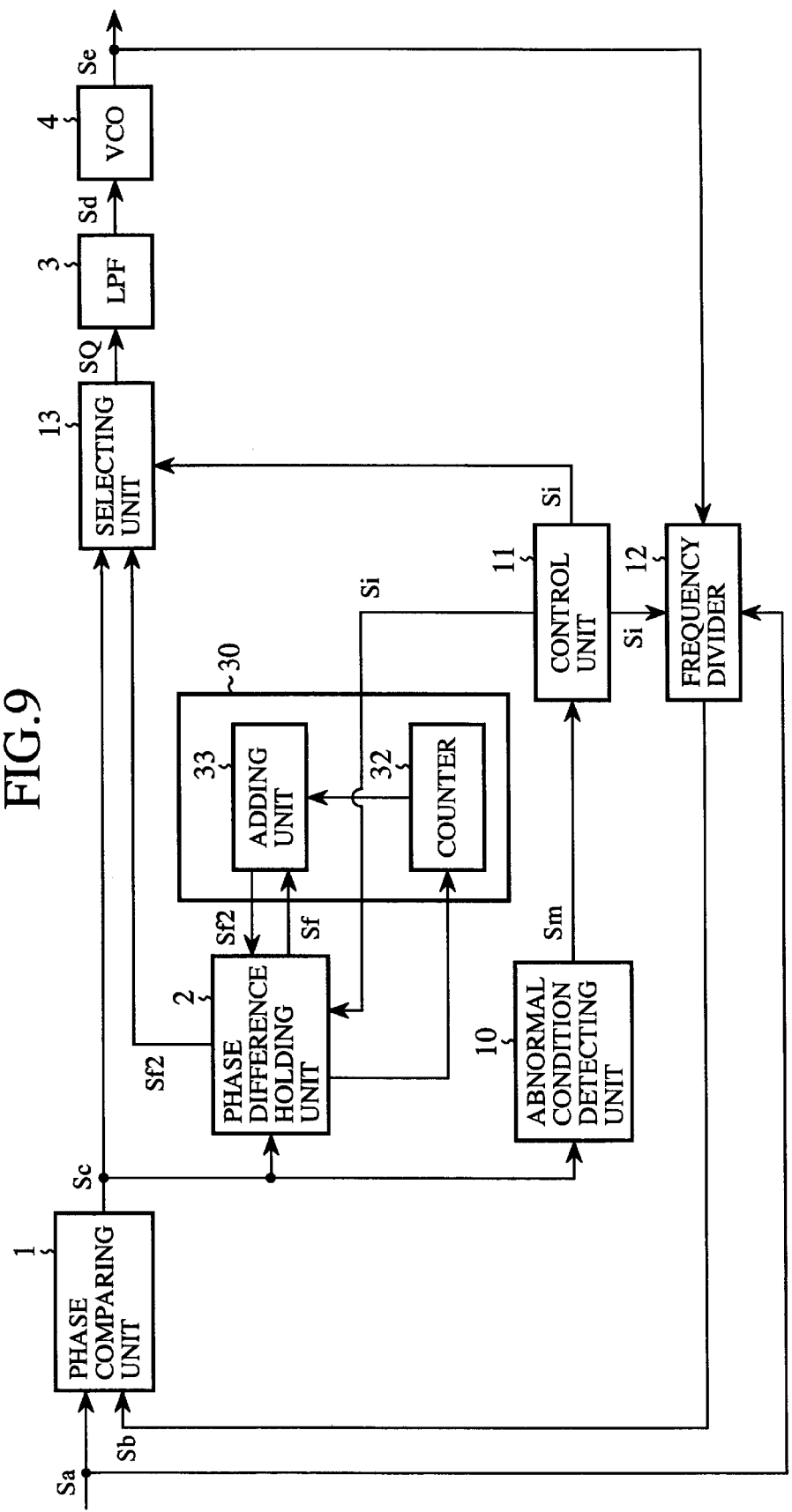

(CASE OF M=4)

(CASE OF M=4)

(CASE OF M=4)

US 6,661,294 B2

PHASE-LOCKED LOOP CIRCUIT

BACKGROUND OF THE INVENTION

1. Field of the Invention

The present invention relates to a phase-locked loop circuit used for circuits operated in synchronization with each other, and more particularly to a phase-locked loop circuit in which a frequency of an oscillation clock signal in a lock state can be stably maintained even at an occurrence time of an abnormal condition such as the loss of a reference input signal.

2. Description of Related Art

FIG. 11 is a block diagram of a first conventional phase-locked loop circuit. In FIG. 11, 51 indicates a tank circuit. 52 indicates a phase comparing unit. 53 indicates a low pass filter (LPF). 54 indicates a voltage controlled crystal oscillator (VCXO). 55 indicates a frequency divider. An output signal of the VCXO 54 is fed back to the phase comparing unit 52 through the frequency divider 55 so as to make a frequency of output signal of the VCXO 54 agree with an input clock signal received in the tank circuit 51. Therefore, a conventional phase-locked loop (PLL) circuit is obtained.

Next, an operation of the first conventional phase-locked loop circuit will be described.

The tank circuit 51 is formed of a transformer, and an input clock signal is held in the tank circuit 51 for a predetermined time. Therefore, even though the input clock signal becomes unstable due to the occurrence of an abnormal condition in the input clock signal, a signal having a constant pulse width can be output from the tank circuit 51 for the predetermined time.

FIG. 12 is a block diagram of a second conventional phase-locked loop circuit. In FIG. 12, 61 indicates a phase comparing unit. 62 indicates a low pass filter (LPF). 63 indicates a voltage controlled crystal oscillator (VCXO) 64 indicates a frequency divider. 65 indicates an interruption detecting circuit for detecting the interruption of a reference clock signal. 66 indicates a control unit. 67 indicates a controlled voltage holding unit for holding and storing an output signal (denoting a controlled voltage for the VCXO 63) of the LPF 62. 68 indicates a selecting unit such as a selector.

In this conventional phase-locked loop circuit, a controlled voltage corresponding to a reference clock signal REF set in a normal condition is held and stored in the controlled voltage holding unit 67, and the interruption of the reference clock signal can be detected in the interruption detecting circuit 65. When the interruption of the reference clock signal is detected, the selection in the selecting unit 68 is changed by the control unit 66, and the controlled voltage held and stored in the controlled voltage holding unit 67 is selected in the selecting unit 68 and is output to the VCXO 63.

FIG. 13 is a block diagram of a third conventional phase-locked loop circuit disclosed in Published Unexamined Japanese Patent Application No. H7-273648 (1995). In FIG. 13, 71 indicates a phase comparing unit. 72 indicates a low pass filter (LPF). 73 indicates a voltage controlled oscillator (VCO). 74 indicates a counter for outputting a count value corresponding to a frequency division operation. 76 indicates a hold over circuit.

The configuration of the hold over circuit 76 is described. 77 indicates an interruption detecting unit. 78 indicates a control unit. 79 indicates a data holding unit. 80 indicates a comparing unit. 81 indicates a counter. 82 indicates a selecting unit. 83 indicates a pulse generating unit.

In the phase comparing unit 71, an error signal Sc indicating a phase difference between an input clock signal Sa and a feed-back signal Sb is produced. In the interruption detecting unit 77, the interruption of the input clock signal Sa is detected, and an interruption signal Sh is output. In the control unit 78, a control signal Si is output according to the interruption signal Sh and a signal Sl. In the data holding unit 79, the error signal Sc is held according to the control signal Si for a prescribed time, and a holding signal Sf denoting the error signal Sc is output. In the comparing unit 80, the error signal Sc and the holding signal Sf are compared with each other, a signal Sj is output in cases where the level of the error signal Sc is higher than that of the holding signal Sf, and the signal Sl is output in cases where the level of the error signal Sc is lower than that of the holding signal Sf. In the counter 81, a count value signal Sg indicating a count value is output according to the signal Sj and a signal Sk. In the selecting unit 82, a selection signal SQ indicating the selection of either the error signal Sc or the holding signal Sf is output according to the control signal Si. In the pulse generating unit 83, the feed-back signal Sb is output in an only case where a signal SB and the count value signal Sg are simultaneously set to a high level.

Next, an operation of the third conventional phase-locked loop circuit will be described below.

When the input clock signal Sa set in a normal condition is received in the phase comparing unit 71, the error signal Sc output from the phase comparing unit 71 is selected in the selecting unit 82, the error signal Sc is output from the selecting unit 82 as the selection signal SQ, the selection signal SQ is smoothed in the low pass filter 72, an oscillation clock signal Se is output from the voltage controlled oscillator 73, a count operation corresponding to a frequency division number is performed in the counter 74 according to the oscillation clock signal Se, and the signal SB is output from the counter 74. Thereafter, a pulse of the feed-back signal Sb is output from the pulse generating unit 83 to the phase comparing unit 71 each time the signal SB and the count value signal Sg simultaneously set to a high level are received in the pulse generating unit 83. Therefore, a phase-locked loop operation is performed in the third conventional phase-locked loop circuit.

When the interruption of the input clock signal Sa occurs due to the occurrence of an abnormal condition in the input clock signal Sa, the interruption of the input clock signal Sa is detected in the interruption detecting unit 77, and the interruption signal Sh is output from the interruption detecting unit 77 to the control signal Si. Thereafter, the control signal Si corresponding to the interruption of the input clock signal Sa is output from the control unit 78 to both the selecting unit 82 and the data holding unit 79. Because the error signal Sc obtained before the interruption of the input clock signal Sa is held in the data holding unit 79, the holding signal Sf denoting the error signal Sc obtained before the interruption of the input clock signal Sa is output from the data holding unit 79 to both the comparing unit 80 and the selecting unit 82 under control of the control signal Si. In the selecting unit 82, the holding signal Sf is selected under control of the control signal Si and is output as the selection signal SQ to the low pass filter 72. In the comparing unit 80, because the error signal Sc is interrupted, the error signal Sc cannot be received, but only the holding signal Sf is received. In this case, no signals Sj, Sk and Sl are generated in the comparing unit 80, an operation of the counter 81 is stopped, and the count value signal Sg keeps the count value obtained before the interruption of the input clock signal Sa. Therefore, the same feed-back signal Sb as that in the normal condition is output from the pulse generating unit 83 to the phase comparing unit 71.

However, in the first conventional phase-locked loop circuit shown in FIG. 11, because the tank circuit 51 has a coil of the transformer, an output condition in the tank circuit 51 is easily changed. Therefore, a problem has arisen that the first conventional phase-locked loop circuit is not stably operated due to the increase of jitters and wonders in an oscillation clock signal output from the voltage controlled crystal oscillator 54. Also, in cases where the interruption of the input clock signal Sa is continued for a long time, another problem has arisen that the first conventional phase-locked loop circuit cannot be adapted for the long time interruption.

Also, in the second conventional phase-locked loop circuit shown in FIG. 12, it is difficult to store a controlled voltage, which is set in a stable condition obtained before the occurrence of an abnormal condition, in the controlled voltage holding unit 67. Therefore, a problem has arisen that an abnormal controlled voltage is output from the controlled voltage holding unit 67 when an abnormal condition such as the interruption of the input clock signal occurs. Also, when a temperature is changed with the passage of time after the interruption of the reference clock signal REF, jitters and wonders are increased in an oscillation clock signal output from the voltage controlled crystal oscillator 63. Therefore, another problem has arisen that the second conventional phase-locked loop circuit is not stably operated due to the increase of jitters and wonders.

Also, in the third conventional phase-locked loop circuit shown in FIG. 13, the comparing operation of the phase comparing unit 71 is continued in a time period from the occurrence of an abnormal condition to the detection of the interruption of the input clock signal, the phase error signal Sc indicating a large phase difference is output from the phase comparing unit 71 in the time period. In this case, the voltage controlled oscillator (VCO) 73 is controlled by the phase error signal Sc, which is produced from the input clock signal Sa set in the abnormal condition and is output from the phase comparing unit 71, until the judgment that the abnormal condition occurs. Therefore, a problem has arisen that the frequency of the oscillation clock signal Se output from the voltage controlled oscillator 73 is considerably changed. Also, another problem has arisen that the phase error signal SC produced from the input clock signal Sa of the abnormal condition is erroneously stored in the data holding unit 79 until the judgment that the abnormal condition occurs.

In detail, there is little probability that the input clock signal Sa set in the normal condition is suddenly interrupted. FIG. 14 is a timing chart showing a phase change of the input clock signal Sa toward the interruption. The input clock signal Sa set in the normal condition is shown on the upper side, and the input clock signal Sa in a transfer time period from the normal condition to the abnormal condition is shown on the lower side. As shown in FIG. 14, when the input clock signal Sa is set in the abnormal condition, pulses of the input clock signal Sa having an abnormal frequency are output, the intermittent loss of the pulses is continued, no edges of the pulses are finally generated, and the interruption of the input clock signal Sa occurs.

In this case, as shown in FIG. 4 prepared for the explanation of the present invention later, even though an occurrence time T1 of the abnormal condition goes by, no interruption of the input clock signal Sa is detected in a time period in which pulses of the input clock signal Sa having an abnormal frequency are output and the intermittent loss of the pulses is continued, but the interruption of the input clock signal Sa is detected at a time T3 sufficiently elapsing after the generation of no edges of pulses of the input clock signal Sa.

SUMMARY OF THE INVENTION

An object of the present invention is to provide, with due consideration to the drawbacks of the conventional phase-locked loop circuit, a phase-locked loop circuit in which an oscillation clock signal having a frequency of an input clock signal set in a lock state is always output without changing a phase of the oscillation clock signal while suppressing wonders or jitters even though an abnormal condition such as the interruption of the input clock signal occurs.

The object is achieved by the provision of a phase-locked loop circuit including an abnormal condition detector for monitoring a pulse width of a phase error signal output from a phase comparator and judging an input clock signal to be in an abnormal condition in a case where the pulse width of the phase error signal exceeds a prescribed threshold value, a phase difference storage for storing the phase error signal output from the phase comparator, a selector for selecting either the phase error signal output from the phase comparator or the phase error signal stored in the phase difference storage and outputting the selected phase error signal to the low pass filter, and a control unit for controlling the selector to select the phase error signal stored in the phase difference storage in a case where it is judged by the abnormal condition detector that the input clock signal is in an abnormal condition.

In the above configuration, when the pulse width of the phase error signal exceeds a prescribed threshold value, the phase error signal stored in the phase difference storage is immediately sent to the low pass filter and the voltage controlled oscillator. Accordingly, the frequency of the input clock signal in the phase lock state can be maintained, no change of a phase of the oscillation clock signal occurs, and jitters and wonders can be suppressed. In particular, even though the interruption of the input clock signal occurs, a considerable change of frequency in the oscillation clock signal can be prevented, and the reliability of the frequency in the phase-locked looped circuit can be improved.

It is preferred that sample data is extracted from the phase error signal by the phase difference storage in synchronization with a sampling clock signal, and the sampling clock signal is obtained from the voltage controlled oscillator.

Therefore, the phase lock-looped circuit can be obtained at a low cost.

It is also preferred that sample data is extracted from the phase error signal by the phase difference storage in synchronization with a sampling clock signal, and the sampling clock signal is obtained from an external oscillator.

Therefore, the sampling clock signal can be easily obtained.

It is also preferred that the phase-locked loop circuit further includes a calculator for consecutively extracting a prescribed number of pulses from the phase error signal output from the phase comparator in a case where it is judged by the abnormal condition detector that the input clock signal is in a normal condition and making the phase difference storage store a width of one pulse in a case where widths of the pulses of the phase error signal agree with each other.

Therefore, the phase error signal in the abnormal condition is not stored in the phase difference storage, but the phase error signal in the normal condition can be stored in the phase difference storage.

It is also preferred that the phase-locked loop circuit further includes a calculator for extracting a prescribed number of pulses from the phase error signal output from the phase comparator in a case where it is judged by the abnormal condition detector that the input clock signal is in a normal condition, performing a calculation operation for widths of the pulses of the phase error signal and making the phase difference storage store an average of the widths of the pulses of the phase error signal.

Therefore, even though the phase of the input clock signal is changed, the oscillation clock signal having a stable phase can be obtained from the average stored in the phase difference storage.

It is also preferred that the average of the widths is calculated in the calculator each time a prescribed number of pulses are extracted from the phase error signal in a time period, each pair of time periods corresponding to two averages consecutively calculated overlap with each other, and one average stored in the phase difference storage as the phase error signal is replaced with the other average most recently calculated among the averages. Therefore, even though the phase of the input clock signal is changed with time, the oscillation clock signal having a stable phase can be obtained from the average most recently calculated in the calculator and stored in the phase difference storage.

It is also preferred that the average of the widths is calculated in the calculator each time a prescribed number of pulses are extracted from the phase error signal in a time period, each pair of time periods corresponding to two averages consecutively calculated overlap with each other, and one average stored in the phase difference storage as the phase error signal is replaced with another average of a prescribed number of averages consecutively calculated in a case where the averages agree with each other.

Therefore, the average stored in the phase difference storage can be replaced with the average having the higher reliability, the oscillation clock signal having a stable phase can be obtained even though the phase of the input clock signal is changed with time.

It is also preferred that the average of the widths is calculated in the calculator each time a prescribed number of pulses are extracted from the phase error signal in a time period, each pair of time periods corresponding to two averages do not overlap with each other, and one average stored in the phase difference storage as the phase error signal is replaced with the other average most recently calculated among the averages.

Therefore, even though the phase of the input clock signal is changed, the average stored in the phase difference storage can be renewed, and the oscillation clock signal having a stable phase can be obtained.

It is also preferred that the average of the widths is calculated in the calculator each time a prescribed number of pulses are extracted from the phase error signal in a time period, each pair of time periods corresponding to two averages do not overlap with each other, and one average stored in the phase difference storage as the phase error signal is replaced with another average of a prescribed number of averages consecutively calculated in a case where the averages agree with each other.

Therefore, the average stored in the phase difference storage can be replaced with the average having the higher reliability, the oscillation clock signal having a stable phase can be obtained even though the phase of the input clock signal is changed with time.

It is also preferred that the feed-back signal is loaded by the frequency divider according to an edge of the input clock signal, in a case where it is judged by the abnormal condition detector that the input clock signal is in the abnormal condition, to make a phase of the feed-back signal approach to that of the input clock signal.

Therefore, the phase of the feed-back signal can approach to that of the input clock signal in a simple configuration of the phase-locked loop circuit.

It is also preferred that a load point is determined by the frequency divider according to an edge of the input clock signal in a case where it is judged by the abnormal condition detector that the input clock signal is in the abnormal condition, and the feed-back signal is loaded with a value of the phase error signal stored in the phase difference storage at the load point by the frequency divider to make a phase of the feed-back signal approach to that of the input clock signal.

Therefore, the loaded feed-back signal can be output in a simple configuration of the phase-locked loop circuit on condition that a phase difference between the input clock signal and the loaded feed-back signal agrees with a phase difference of the phase error signal stored in the phase difference storage.

BRIEF DESCRIPTION OF THE DRAWINGS

FIG. 4 is a timing chart showing a timing of the detection of an abnormal condition after the occurrence of the abnormal condition in an external input clock signal;

FIG. 9 is a block diagram of a phase-locked loop circuit including another internal configuration of the calculating unit according to the fifth embodiment of the present invention;

DETAILED DESCRIPTION OF THE PREFERRED EMBODIMENTS

Embodiments of the present invention will now be described with reference to the accompanying drawings.
Embodiment 1

Figure 1:
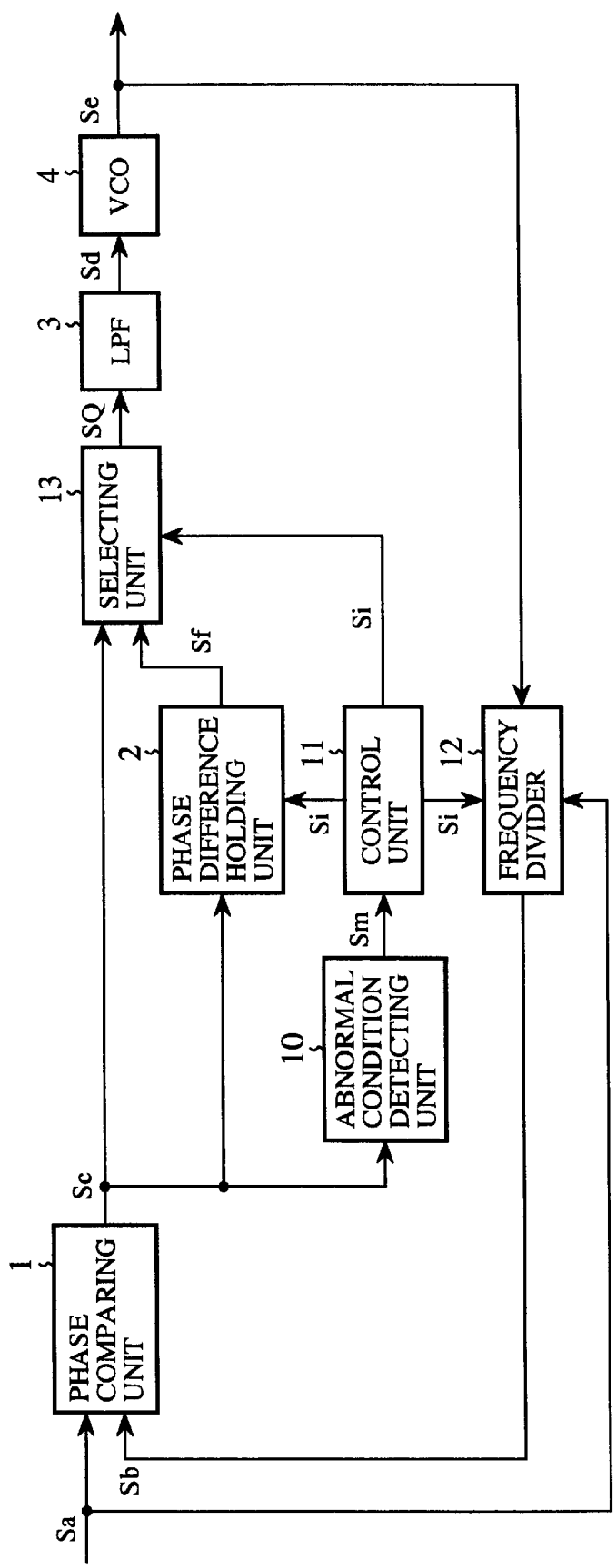
FIG. 1 is a block diagram of a phase-locked loop circuit according to a first embodiment of the present invention.

FIG. 1 is a block diagram of a phase-locked loop circuit according to a first embodiment of the present invention. In FIG. 1, 1 indicates a phase comparing unit (or phase comparator). 2 indicates a phase difference holding unit (or phase difference storage). 3 indicates a low pass filter (LPF). 4 indicates a voltage controlled oscillator (VCO) 10 indicates an abnormal condition detecting unit (or abnormal condition detector). 11 indicates a control unit. 12 indicates a frequency divider. 13 indicates a selecting unit (or selector).

In the phase comparing unit 1, a phase of an external input clock signal Sa having a predetermined frequency is compared with a phase of a feed-back signal Sb, and a phase error signal Sc indicating a phase difference between the external input clock signal Sa and the feed-back signal Sb is output. In the phase difference holding unit 2, the phase error signal Sc output from the phase comparing unit 1 is held and output as a holding signal Sf. In the abnormal condition detecting unit 10, a pulse width of the phase error signal Sc output from the phase comparing unit 1 is monitored, and a detecting signal Sm indicating the detection of an abnormal condition is output in cases where the pulse width exceeds a prescribed threshold value τth. In cases where the pulse width does not exceed the prescribed threshold value τth, a detecting signal Sm indicating the detection of a normal condition is output.

In the control unit 11, a control signal Si is produced according to the detecting signal Sm output from the abnormal condition detecting unit 10 to determine the selection of either the phase error signal Sc output from the phase comparing unit 1 or the holding signal Sf output from the phase difference holding unit 2. In the selecting unit 13, either the phase error signal Sc output from the phase comparing unit 1 or the holding signal Sf output from the phase difference holding unit 2 is selected according to the control signal Si received from the control unit 11, and a selected signal SQ denoting either the phase error signal Sc or the holding signal Sf is output to the low pass filter 3.

In the low pass filter (LPF) 3, the selected signal SQ (that is, either the phase error signal Sc or the holding signal Sf) is smoothed, and a voltage controlled signal Sd is produced. In the voltage controlled oscillator (VCO) 4, an oscillation clock signal Se having a prescribed oscillation frequency is output in response to the voltage controlled signal Sd output from the low pass filter 3. In the frequency divider 12, a frequency of the oscillation clock signal Se output from the voltage controlled oscillator 4 is divided to reduce a frequency of the oscillation clock signal Se at a predetermined rate, and the feed-back signal Sb is fed back to the phase comparing unit 1. Also, in the frequency divider 12, when a detecting signal Sm indicating an abnormal condition is sent from the abnormal condition detecting unit 10 to the control unit 11, a frequency dividing start timing (or a load point) is determined from an edge of the external input clock signal Sa according to a control signal Si of the control unit 11, and a frequency-divided signal obtained by dividing a frequency of the oscillation clock signal Se is loaded at the frequency dividing start timing so as to produce a feed-back signal Sb of which the phase approaches that of the external input clock signal Sa.

Next, an operation of the phase-locked loop circuit will be described below with reference to FIG. 2A to FIG. 2F.

FIG. 2A to FIG. 2F are respectively a timing chart of the external input clock signal Sa, the feed-back signal Sb, the phase error signal Sc and the selected signal SQ (that is, either the phase error signal Sc or the holding signal Sf) received in the low pass filter 3.

Figure 2A:
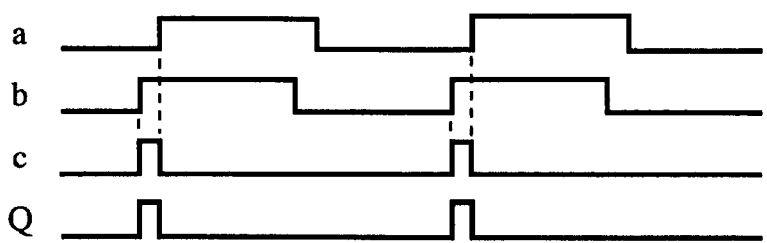
FIG. 2A to FIG. 2F are respectively a timing chart of signals of the phase-locked loop circuit.

(1) An operation in a normal condition (or an operation in a phase lock obtained in the voltage controlled oscillator 4) shown in FIG. 2A In the phase comparing unit 1, a phase of the external input clock signal Sa is compared with a phase of the feed-back signal Sb output from the frequency divider 12, and the phase error signal Sc is output. In the abnormal condition detecting unit 10, a pulse width of the phase error signal Sc output from the phase comparing unit 1 is monitored, and it is ascertained that the pulse width is lower than the prescribed threshold value τth. Therefore, a detecting signal Sm indicating the detection of a normal condition is output from the abnormal condition detecting unit 10 to the control unit 11, and a control signal Si in the normal condition is output from the control unit 11 to the phase difference holding unit 2, the frequency divider 12 and the selecting unit 13.

Figure 3A:
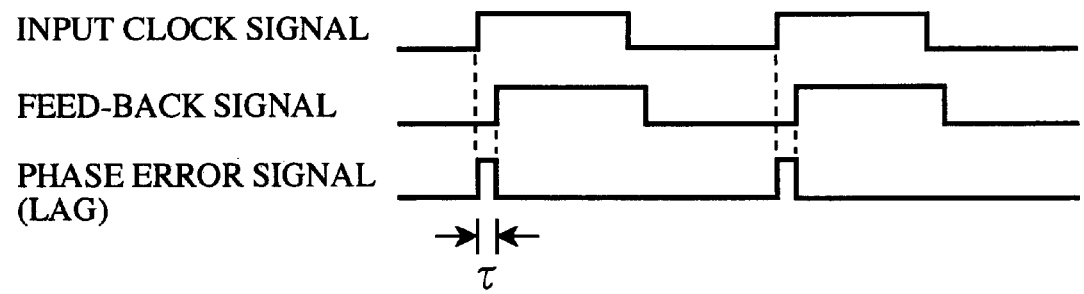
FIG. 3A is a timing chart showing a phase difference τth between a reference clock signal and a frequency-divided signal in a case where a phase of the frequency-divided signal lags behind that of the reference clock signal.
Figure 3B:
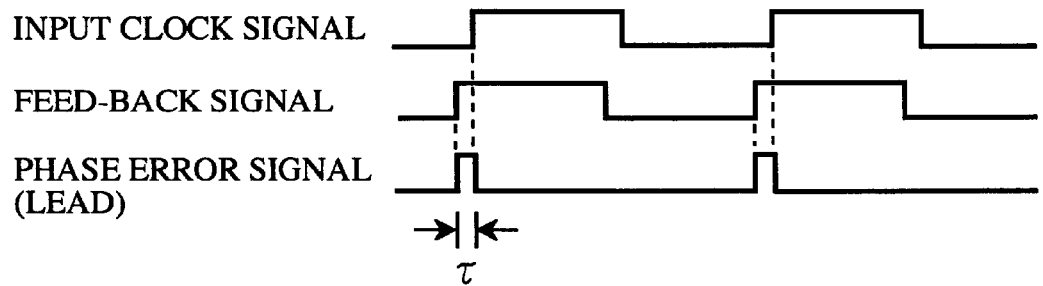
FIG. 3B is a timing chart showing a phase difference τth between a reference clock signal and a frequency-divided signal in a case where a phase of the frequency-divided signal leads that of the reference clock signal.

FIG. 3A is a timing chart showing a phase difference between the external input clock signal Sa denoting a reference clock signal and the feed-back signal Sb denoting a frequency-divided signal in a case where a phase of the feed-back signal Sb lags behind that of the external input clock signal Sa, and FIG. 3B is a timing chart showing a phase difference between the external input clock signal Sa denoting a reference clock signal and the feed-back signal Sb denoting a frequency-divided signal in a case where a phase of the feed-back signal Sb leads that of the external input clock signal Sa.

In the abnormal condition detecting unit 10, regardless of whether the phase of the feed-back signal Sb lags behind or leads that of the external input clock signal Sa, it is detected that a phase error (or a phase difference) is higher or lower than the prescribed threshold value τth.

Returning to FIG. 2A, the phase error signal Sb of the phase comparing unit 1 is held in the phase difference holding unit 2. In the selecting unit 13, the phase error signal Sc directly output from the phase comparing unit 1 and the holding signal Sf output from the phase difference holding unit 2 are received, the phase error signal Sc is selected according to the control signal Si set in the normal condition, and the selected signal SQ denoting the phase error signal Sc directly output from the phase comparing unit 1 is output to the low pass filter 3.

In the low pass filter 3, a high frequency component of the selected signal SQ is removed to smooth the selected signal SQ, and the voltage controlled signal Sd is produced. The voltage controlled signal Sd is received in the voltage controlled oscillator 4. In the voltage controlled oscillator 4, a frequency of the voltage controlled signal Sd is controlled to produce the oscillator clock signal Se, and the oscillator clock signal Se is output. Also, the oscillator clock signal Se is input to the frequency divider 12. In the frequency divider 12, the frequency of the oscillator clock signal Se is reduced at a prescribed rate to produce the feed-back signal Sb, and the feed-back signal Sb is fed back to the phase comparing unit 1.

Figure 2B:
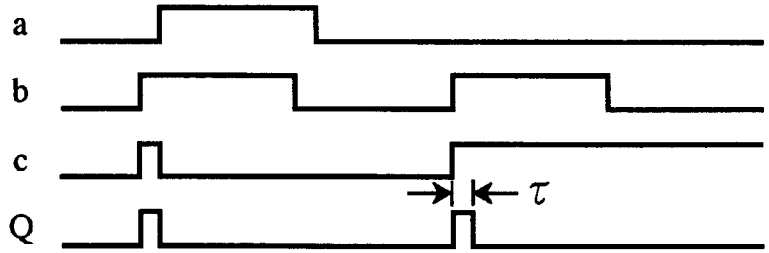

(2) An operation in the beginning of non-synchronization of the signals Sa and Sb (refer to FIG. 2B)

When a pulse width of the phase error signal Sc output from the phase comparing unit 1 exceeds the prescribed threshold value τth due to the occurrence of an abnormal condition in the external input clock signal Sa, the abnormal condition of the external input clock signal Sa is detected in the abnormal condition detecting unit 10, and a detecting signal Sm indicating the detection of the abnormal condition is output from the abnormal condition detecting unit 10 to the control unit 11. Therefore, in response to the detecting signal Sm, the control unit 11 controls the selecting unit 13 to select the holding signal Sf output from the phase difference holding unit 2 and to output the holding signal Sf as the selected signal SQ. Also, the control unit 11 controls the phase difference holding unit 2 to stop holding the phase error signal Sc newly sent from the phase comparing unit 1. Also, the control signal Si is sent from the control unit 11 to the frequency divider 12. Therefore, the low pass filter 3 and the voltage controlled oscillator 4 are operated according to the holding signal Sf in the same manner as in the normal condition.

(3) An operation in the abnormal condition

In the phase difference holding unit 2, the holding of the phase error signal Sc newly sent from the phase comparing unit 1 is stopped according to the control signal Si, and the phase error signal Sc already held before the detection of the occurrence of the abnormal condition is output as the holding signal Sf.

Figure 2C:
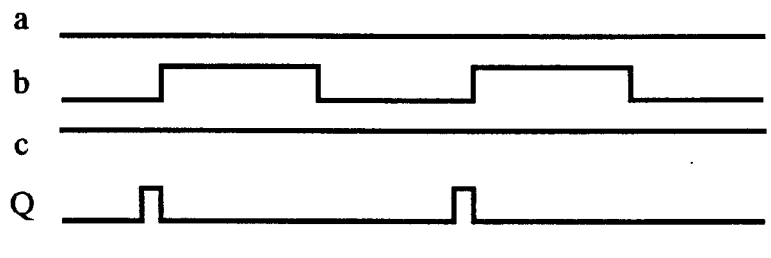

In the selecting unit 13, the holsing signal Sf of the phase difference holding unit 2 is selected from the received signals Sc and Sf in response to the control signal Si and is output as the selected signal SQ. Therefore, the low pass filter 3 and the voltage controlled oscillator 4 are operated in the same manner as in the normal operation. For example, as shown in FIG. 2C, when the interruption of the external input clock signal Sa occurs, the selection of the output signal Sf (that is, the phase error signal Sc already held in the phase difference holding unit 2) is performed according to the control signal Si.

Figure 2D:
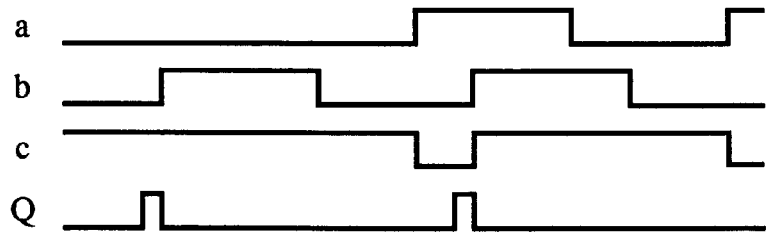

Thereafter, the reception of the external input clock signal Sa is continued, and it begins to set the external input clock signal Sa to a normal condition. A phase relationship between the external input clock signal Sa and the feed-back signal Sb in the beginning of the setting of the external input clock signal Sa to a normal condition is shown in FIG. 2D.

Figure 2E:
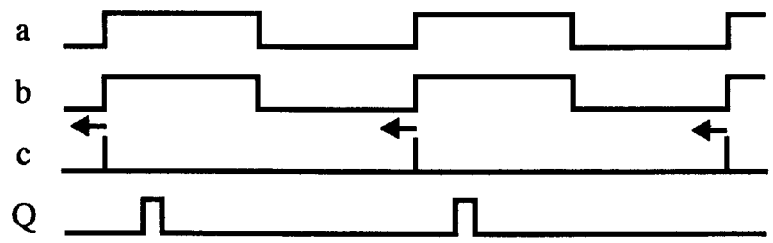

(4) An operation in the recovery of the synchronization of the signals Sa and Sb The phase of the feed-back signal Sb is changed in the frequency divider 12 so as to make the phase of the feed-back signal Sb agree with the phase of the external input clock signal Sa. As shown in FIG. 2E, the phase error signal Sc output from the phase comparing unit 1 is monitored in the abnormal condition detecting unit 10. When a prescribed recovering condition is satisfied in the phase error signal Sc, it is judged by the abnormal condition detecting unit 10 that the phase error signal Sc is again set to the normal condition, and a detecting signal Sm indicating the detection of the normal condition is output from the abnormal condition detecting unit 10. For example, in cases where widths of N pulses of the phase error signal Sc are consecutively set to the same value as each other and are lower than the threshold value τth, the prescribed recovering condition is satisfied in the phase error signal SC.

Figure 2F:
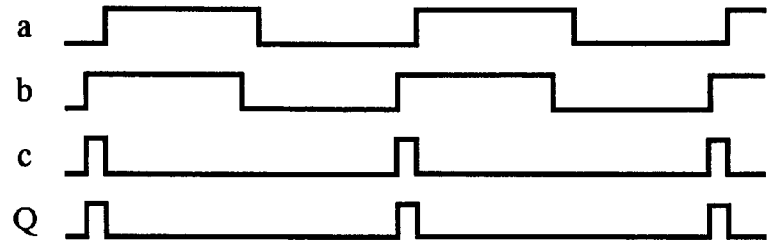

Thereafter, as shown in FIG. 2F, the feed-back signal Sb is again locked. Therefore, the same phase relationship as that shown in FIG. 2A is obtained.

Figure 12:
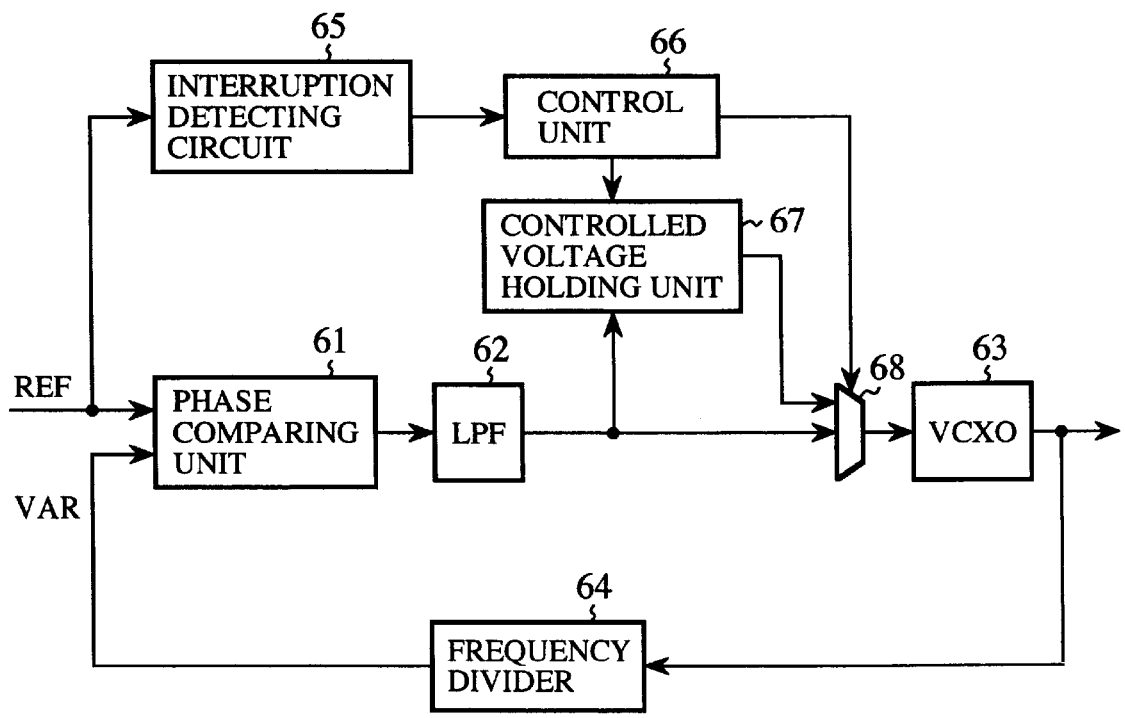
FIG. 12 is a block diagram of a second conventional phase-locked loop circuit.
Figure 14:
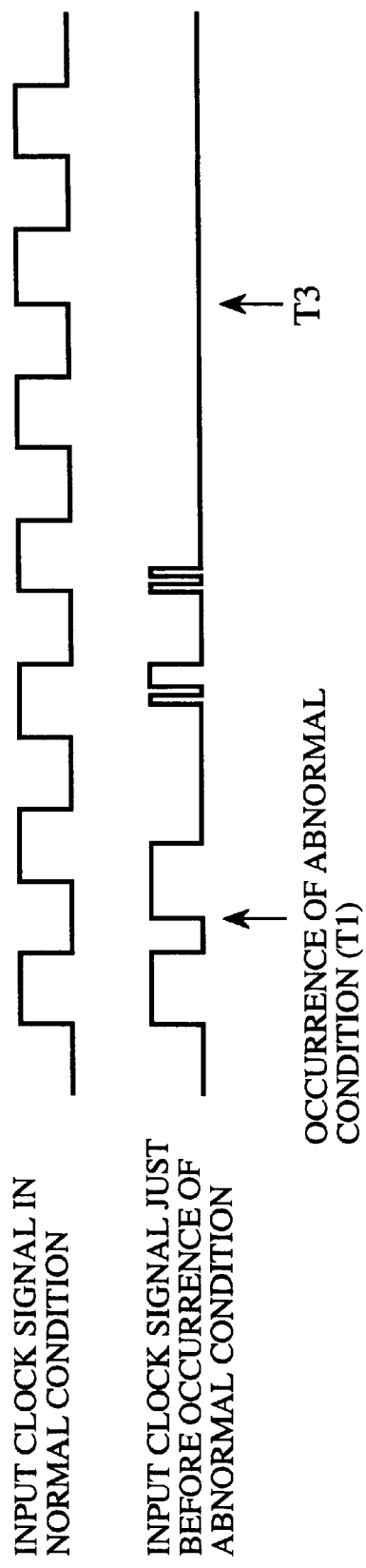
FIG. 14 is time charts showing a phase change of an input clock signal toward the interruption of the input clock signal after the occurrence of an abnormal condition.

In the interruption detecting operation for the input clock signal Sa performed in the interruption detecting circuit 65 of the second prior art (FIG. 12), when edges of several pulses of the input clock signal Sa are lost, it is judged that the interruption of the input clock signal Sa occurs. As is described before with reference to FIG. 14, in cases where the interruption of the input clock signal Sa occurs, there is little probability that the input clock signal Sa normally maintaining a prescribed frequency is suddenly interrupted.

FIG. 4 is a timing chart showing a timing of the detection of an abnormal condition after the occurrence of the abnormal condition in the external input clock signal Sa. A phase change of the external input clock signal Sa in a time period from a time of the normal condition to a time of the abnormal condition causing the interruption of the external input clock signal Sa is shown on the upper side. When the external input clock signal Sa is set in an abnormal condition, the outputting of pulses of an abnormal frequency or the pulse losing is continued in the external input clock signal Sa in a first stage. Thereafter, the external input clock signal Sa has no edge in a final stage, and the interruption of the external input clock signal Sa occurs.

In the first embodiment, when a width of a pulse of the phase error signal Sc output from the phase comparing unit 1 exceeds the prescribed threshold value τth, the abnormal condition of the external input clock signal Sa is immediately detected in the abnormal condition detecting unit 10. Therefore, the holding signal Sf output from the phase difference holding unit 2 is immediately selected and is output from the selecting unit 13 as the selected signal SQ. Accordingly, even though the interruption of the external input clock signal Sa occurs, a signal selected in the selecting unit 13 can be changed to the holding signal Sf having a stable pulse width, the holding signal Sf having a stable pulse width can be sent to the low pass filter 3 as the selected signal SQ, the change of frequency in the low pass filter 3 and the voltage controlled oscillator 4 can be suppressed, and it can be prevented that an abnormal output of the phase comparing unit 1 is erroneously held and stored in the phase difference holding unit 2.

Figure 13:
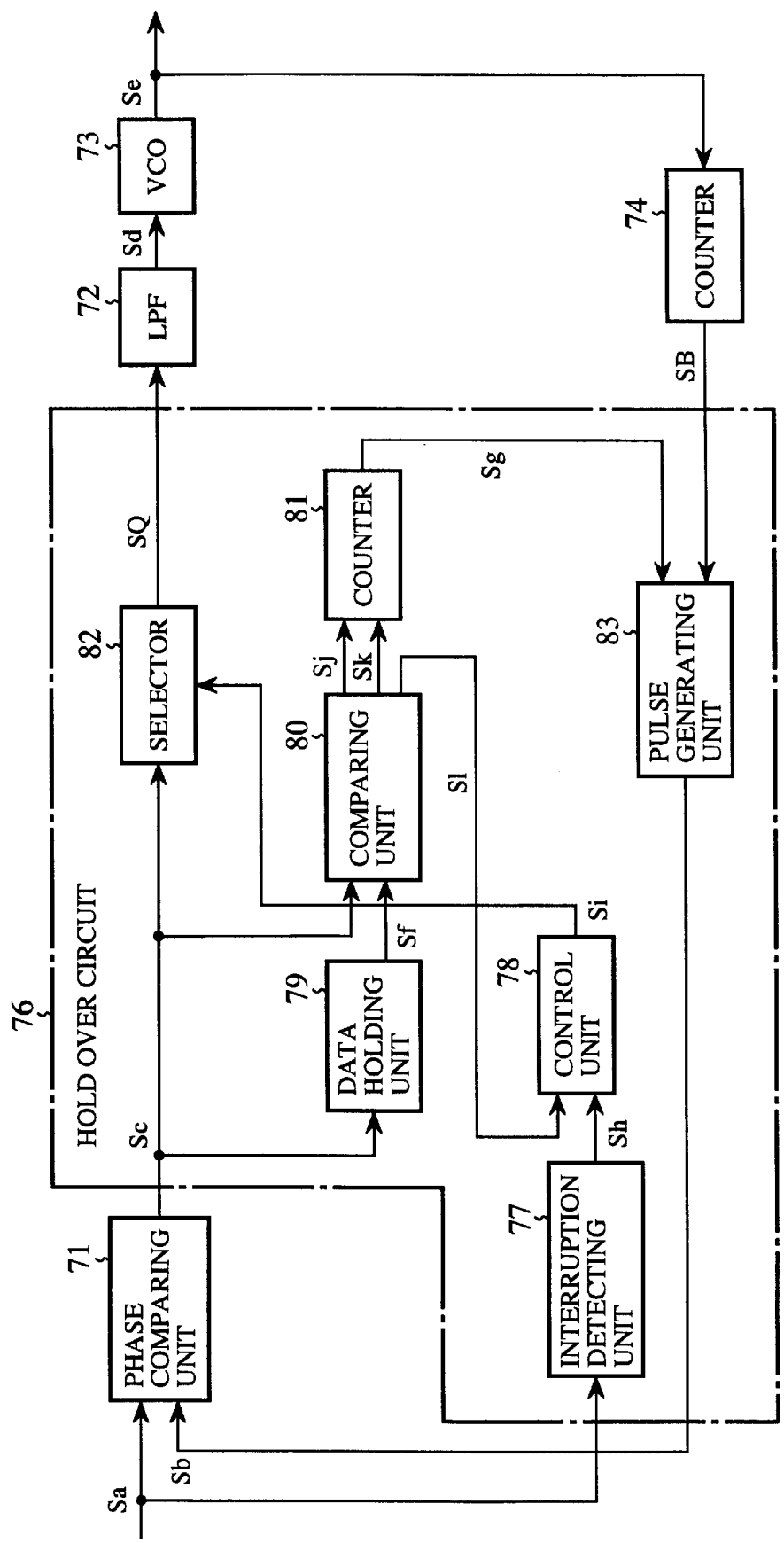
FIG. 13 is a block diagram of a third conventional phase-locked loop circuit.

A difference in the interruption (or abnormal condition) detecting timing between the detection in the prior art and the detection in the first embodiment will be described below. The detection of the abnormal condition in the third conventional phase-locked loop circuit (refer to FIG. 13) is shown on the middle side of FIG. 4. In the third conventional phase-locked loop circuit, the interruption of the input clock signal Sa is detected according to the input clock signal Sa received in the phase comparing unit 71. However, because the comparing operation is continued in the phase comparing unit 71 during a time period from the occurrence of the abnormal condition of the input clock signal Sa at a time T1 to the detection of the interruption of the input clock signal Sa at a time T3, a phase error signal Sc indicating a large phase difference is output from the phase comparing unit 71. Therefore, because the voltage controlled oscillator (VCO) 73 is controlled by the voltage controlled signal Sd derived from an abnormal output which is obtained in the abnormal condition before the abnormal condition judgment (or the detection of the interruption of the input clock signal Sa) at the time T3, a problem has arisen that the frequency of the oscillator clock signal Se output from the voltage controlled oscillator 73 is considerably changed. Also, another problem has arisen that there is a probability that the phase error signal Sc of the phase comparing unit 71 obtained in the abnormal condition before the judgment to be the abnormal condition is stored in the data holding unit 79.

The detection of the abnormal condition in the first embodiment is shown on the lower side of FIG. 4. When a width of a pulse of the phase error signal Sc output from the phase comparing unit 1 exceeds the threshold value τth, it is judged that the abnormal condition is detected. Therefore, the abnormal condition can be immediately detected at a time T2 which is later than an abnormal condition occurring time T1 by only a time period shorter than a width of a clock pulse.

As is described above, in the first embodiment, the prescribed threshold value τth is used, and the detection of the abnormal condition is judged when a width of a pulse of the phase error signal Sc output from the phase comparing unit 1 exceeds the prescribed threshold value τth. Therefore, the abnormal condition can be immediately detected when the abnormal condition occurs in the external input clock signal Sa, a signal selected in the selecting unit 13 can be changed to the holding signal Sf having a stable pulse width, and the change of frequency in the low pass filter 3 and the voltage controlled oscillator 4 can be suppressed. Also, it can be prevented that an abnormal output of the phase comparing unit 1 is erroneously held and stored in the phase difference holding unit 2.

Embodiment 2

Figure 5:
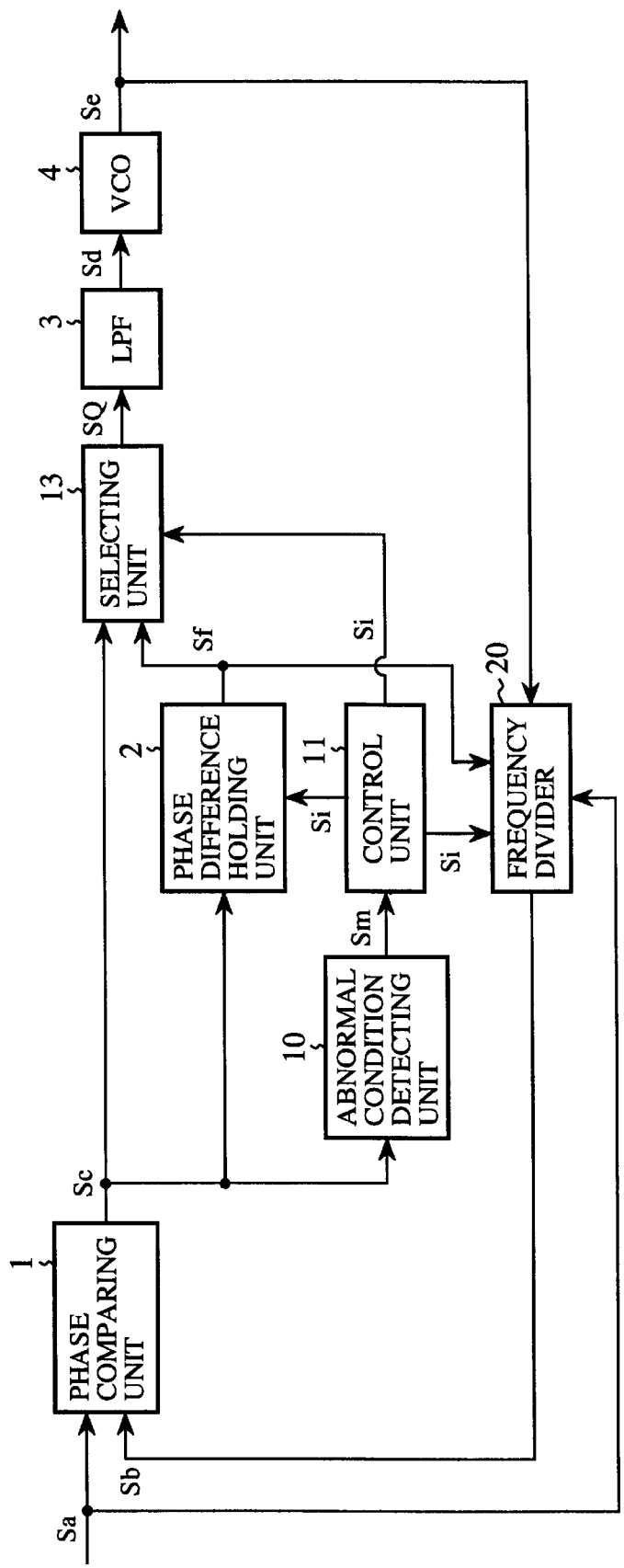
FIG. 5 is a block diagram of a phase-locked loop circuit according to a second embodiment of the present invention.

FIG. 5 is a block diagram of a phase-locked loop circuit according to a second embodiment of the present invention. The constituent elements of FIG. 5, which are the same as those shown in FIG. 1, are indicated by the same reference numerals as those of the constituent elements shown in FIG. 1, and additional description of those constituent elements is omitted.

In FIG. 5, 20 indicates a frequency divider having the configuration differing from that of the frequency divider 12. The frequency divider 20 is configured to receive the phase error signal Sc held in the phase difference holding unit 2 as the holding signal Sf. Also, the frequency divider 20 has a function for dividing a frequency of the oscillation clock signal Se output from the voltage controlled oscillator 4 to reduce a frequency of the oscillation clock signal Se at a predetermined rate and to produce a frequency-divided clock signal. In addition, the frequency divider 20 has a function for giving a load to the frequency-divided clock signal according to a pulse width of the phase error signal Sc held in the phase difference holding unit 2 to produce a feed-back signal Sb. In detail, when a detecting signal Sm indicating an abnormal condition is sent from the abnormal condition detecting unit 10 to the control unit 11, a load timing (or a load point) is determined from an edge of the external input clock signal Sa according to a control signal Si of the control unit 11, the frequency-divided signal obtained by dividing a frequency of the oscillation clock signal Se is loaded at the load timing so as to make a phase difference between the external input clock signal Sa and the feed-back signal Sb agree with a pulse width of the phase error signal Sc held in the phase difference holding unit 2, and the feed-back signal Sb is fed back to the phase comparing unit 1.

As is described above, in the second embodiment, because the feed-back signal Sb is loaded at the load timing, a change of the phase of the oscillation clock signal Se in the recovery from the abnormal condition can be further reduced in the phase-locked loop circuit as compared with a change of the phase in the phase-locked loop circuit of the first embodiment shown in FIG. 1.

Embodiment 3

Figure 6:
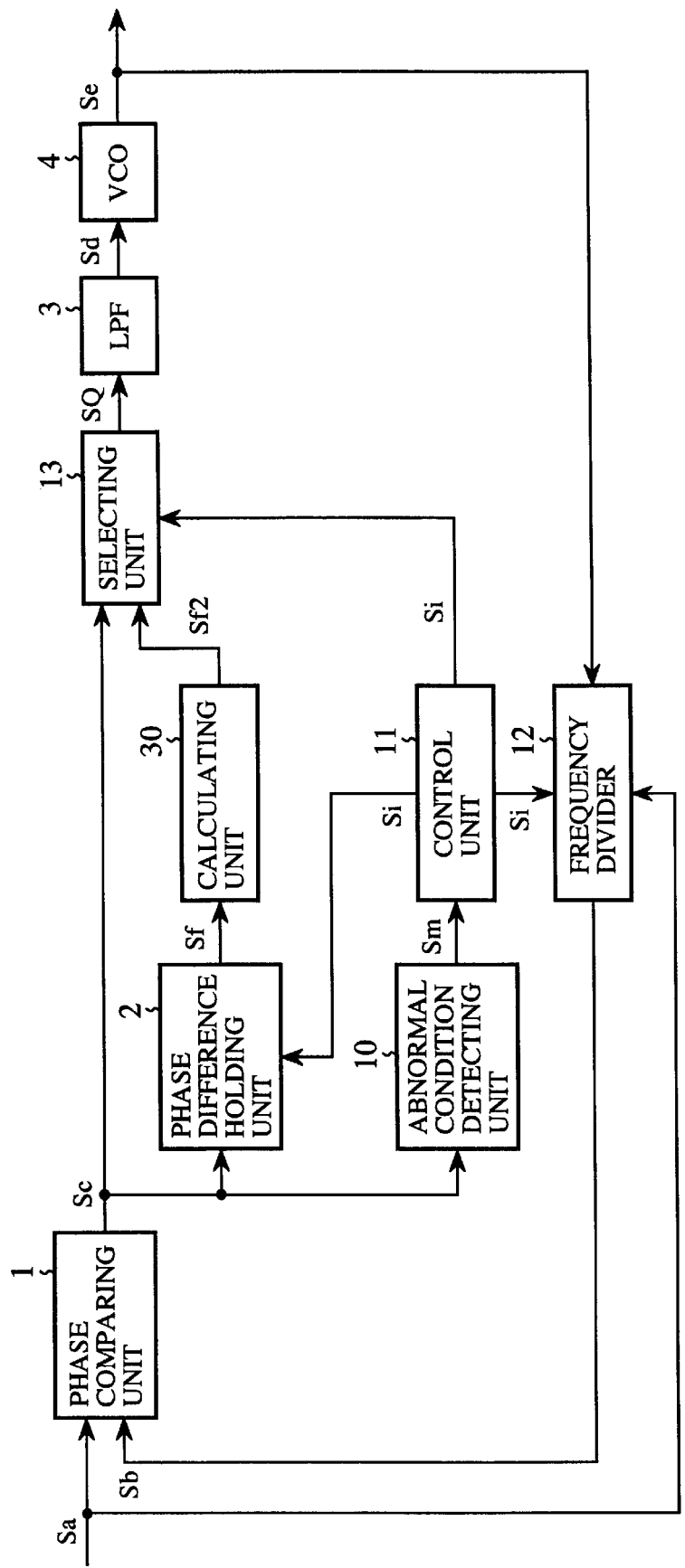
FIG. 6 is a block diagram of a phase-locked loop circuit according to a third embodiment of the present invention.

FIG. 6 is a block diagram of a phase-locked loop circuit according to a third embodiment of the present invention. The constituent elements of FIG. 6, which are the same as those shown in FIG. 1, are indicated by the same reference numerals as those of the constituent elements shown in FIG. 1, and additional description of those constituent elements is omitted.

In FIG. 6, 30 indicates a calculating unit (calculator) for performing a calculation operation for a plurality of pulses of the phase error signal Sc which are held one after another in the phase difference holding unit 2 as pulses of the holding signal Sf. The precision in this phase-locked loop circuit at a hold-over time is heightened as compared with that in the phase-locked loop circuit of the first embodiment shown in FIG. 1.

In the calculating unit 30, a calculation operation is performed to produce a phase error signal Sf2 having a stable pulse width from a plurality of pulses of the phase error signal Sc held one after another in the phase difference holding unit 2, and the phase error signal Sf2 is output to the selecting unit 13. In the calculation operation, as is described later in detail, it is judged whether or not widths of N pulses consecutively placed in the phase error signal Sc agree with each other, or an average of widths of a plurality of pulses (of a prescribed number M) consecutively placed in the phase error signal Sc is calculated.

As is described above, in the third embodiment, because the calculation operation is performed for a plurality of pulses of the phase error signal Sc held one after another in the phase difference holding unit 2, a pulse width of the phase error signal Sc can be further stabilized.

Embodiment 4

Figure 7:
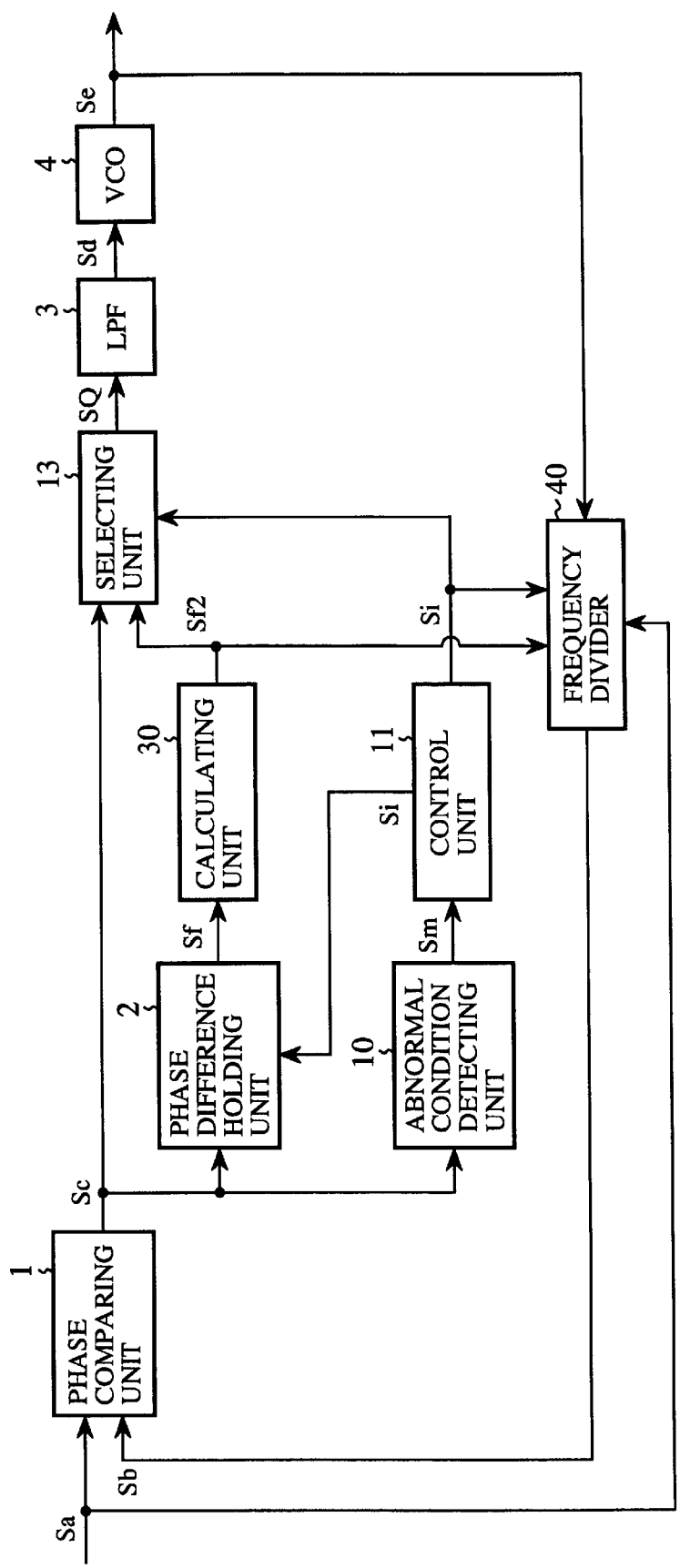
FIG. 7 is a block diagram of a phase-locked loop circuit according to a fourth embodiment of the present invention.

FIG. 7 is a block diagram of a phase-locked loop circuit according to a fourth embodiment of the present invention. The constituent elements of FIG. 7, which are the same as those shown in FIG. 1 or FIG. 6, are indicated by the same reference numerals as those of the constituent elements shown in FIG. 1 or FIG. 6, and additional description of those constituent elements is omitted.

The phase-locked loop circuit of the fourth embodiment is obtained by combining the phase-locked loop circuit of the second embodiment shown in FIG. 5 and the phase-locked loop circuit of the third embodiment shown in FIG. 6, and a change of the phase of the oscillation clock signal Se in the recovery from the abnormal condition is further reduced, and the precision at a hold-over time is further heightened in the phase-locked loop circuit.

In FIG. 7, 40 indicates a frequency divider configured to receive the phase error signal Sc held in the phase difference holding unit 2 as the holding signal Sf. Also, the frequency divider 40 has a function for dividing a frequency of the oscillation clock signal Se output from the voltage controlled oscillator 4 to reduce a frequency of the oscillation clock signal Se at a predetermined rate and to produce a frequency-divided clock signal. In addition, the frequency divider 40 has a function for giving a load to the frequency-divided clock signal according to a pulse width of the phase error signal Sc to produce a feed-back signal Sb. In detail, when a detecting signal Sm indicating an abnormal condition is sent from the abnormal condition detecting unit 10 to the control unit 11, a load timing is determined from an edge of the external input clock signal Sa according to a control signal Si of the control unit 11, the frequency-divided clock signal Sb obtained by dividing a frequency of the oscillation clock signal Se is loaded at the load timing so as to make a phase difference between the external input clock signal Sa and the feed-back signal Sb agree with a pulse width of the phase error signal Sf2 produced in the calculating unit 30, and the feed-back signal Sb is fed back to the phase comparing unit 1.

As is described above, in the fourth embodiment, a change of the phase of the oscillation clock signal Se in the recovery from the abnormal condition can be further reduced in the phase-locked loop circuit. Also, a pulse width of the phase error signal Sc held in the phase difference holding unit 2 can be further stabilized.

Embodiment 5

In a fifth embodiment, the calculation operation performed in the calculating unit 30 of the third and fourth embodiments is described in detail.

Figure 8:
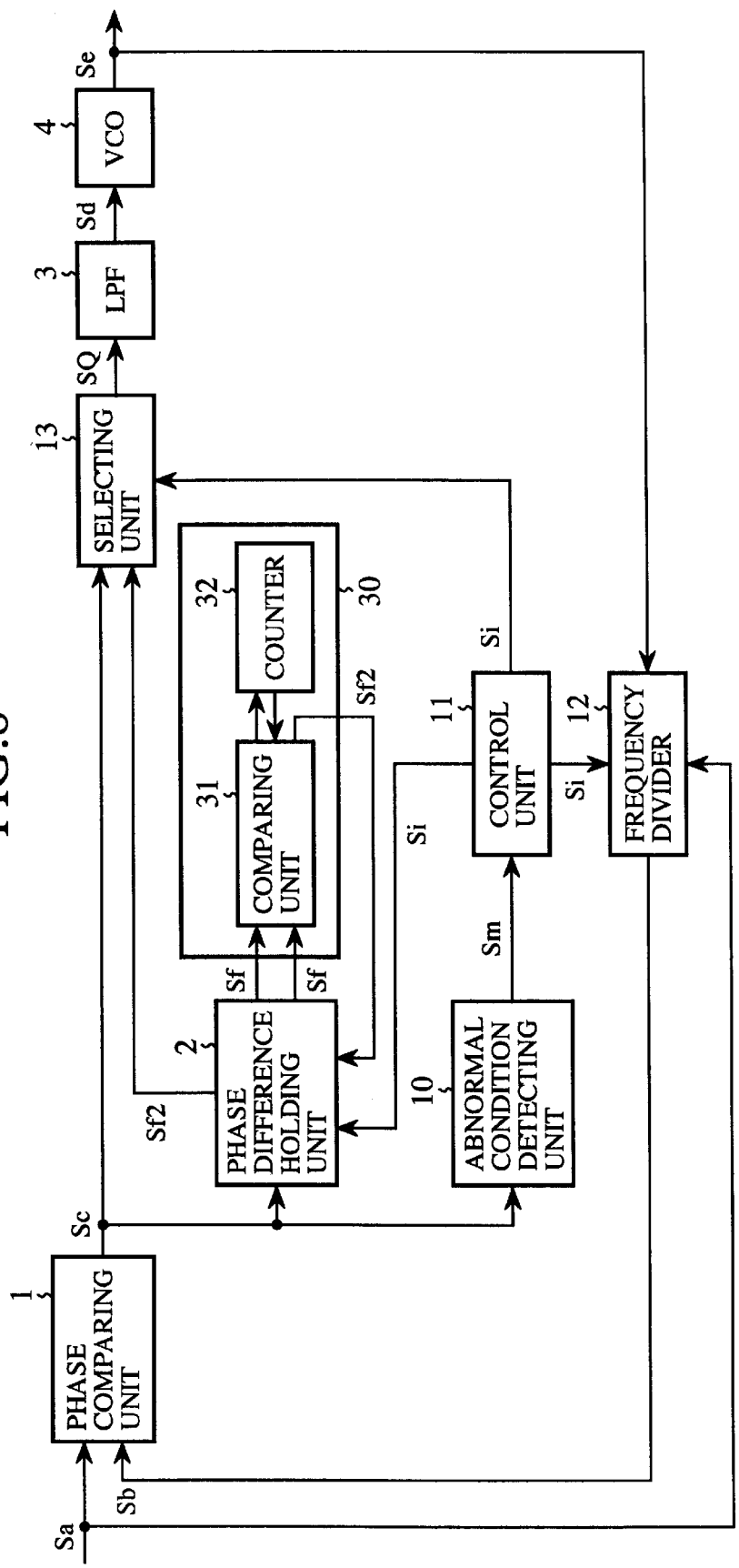
FIG. 8 is a block diagram of a phase-locked loop circuit including an internal configuration of a calculating unit according to a fifth embodiment of the present invention.

(1) The calculation operation of the agreement of widths of N consecutive pulses with each other FIG. 8 is a block diagram of a phase-locked loop circuit including an internal configuration of the calculating unit 30 to describe the calculation operation of the agreement of widths of N consecutive pulses with each other according to a fifth embodiment of the present invention. In FIG. 8, 31 indicates a comparing unit of the calculating unit 30, and 32 indicates a counter of the calculating unit 30.

An operation of the calculating unit 30 will be described below.

In the phase difference holding unit 2, pieces of sample data are extracted one after another from the phase error signal Sc of the phase comparing unit 1 in synchronization with a prescribed clock signal, and the pieces of sample data of the received phase error signal Sc are latched (or held). Each piece of sample data indicates a width of one pulse of the phase error signal Sc. The prescribed clock signal for the sampling operation is obtained by using either the voltage controlled oscillator (VCO) 4 of the phase-locked loop circuit or an external oscillator.

In detail, in this sampling operation of the phase difference holding unit 2, two pieces of sample data of the phase error signal Sc most recently received are extracted in synchronization with the prescribed clock signal and are latched. In the comparing unit 31 of the calculating unit 30, the two pieces of sample data are compared with each other, and a count value of the counter 32 is incremented by one in cases where the two pieces of sample data indicating pulse widths are the same as each other. The sampling and comparing operations of the comparing unit 31 and the incrementing operation of the counter 32 are repeatedly performed. When the count value of the counter 32 reaches a prescribed number N−1, a phase error signal Sf2 indicating a pulse width of the piece of sample data finally extracted is output from the comparing unit 31 and is held in the phase difference holding unit 2 in place of the phase error signal Sc received from the phase comparing unit 1.

Therefore, when widths of pulses of N pieces of sample data agree with each other, the pulse widths are set as a stationary phase difference, a phase error signal Sf2 indicating the stationary phase difference is output from the phase difference holding unit 2 to the selecting unit 13, and the phase error signal Sf2 indicating the stationary phase difference is selected in the selecting unit 13 when the occurrence of the abnormal condition is detected.

(2) The calculation operation of an average of widths of M pulses

FIG. 9 is a block diagram of a phase-locked loop circuit including an internal configuration of the calculating unit 30 to describe the calculation operation of an average of widths of M pulses according to the fifth embodiment of the present invention. In FIG. 9, 33 indicates an adder, and the calculating unit 30 comprises the adder 33 and the counter 32.

An operation of the calculating unit 30 will be described below.

In the phase difference holding unit 2, pieces of sample data are extracted one after another from the phase error signal Sc of the phase comparing unit 1 in synchronization with the prescribed clock signal, and the pieces of sample data of the received phase error signal Sc are latched (or held). Each piece of sample data indicates a width of one pulse of the phase error signal Sc. In detail, in this sampling operation of the phase difference holding unit 2, a piece of sample data of the phase error signal Sc most recently received is repeatedly extracted in synchronization with the prescribed clock signal and is latched. The piece of sample data is added to pieces of sample data already added in the adder 33 to obtain a sum of pulse widths, and a count value is incremented in the counter 32 each time the piece of sample data is added in the adder 33. When the count value reaches a prescribed number M, the right shift corresponding to the division by the prescribed number M is performed in the adder 33 for a bit string of binary data indicating the sum of the M pulse widths to divide the sum of the M pulse widths by the prescribed number M and to obtain an average of the M pulse widths, and a phase error signal Sf2 indicating the average of the M pulse widths is held in the phase difference holding unit 2 in place of the phase error signal Sc received from the phase comparing unit 1. For example, in case of M=8, the right shift of 3 bits is performed for the sum of the eight pulse widths, and an average of the eight pulse widths is obtained. Thereafter, the average of the M pulse widths is set as a stationary phase difference, a phase error signal Sf2 indicating the stationary phase difference is output from the phase difference holding unit 2 to the selecting unit 13, and the phase error signal Sf2 indicating the stationary phase difference is selected in the selecting unit 13 when the occurrence of the abnormal condition is detected.

An average of M pieces of sample data indicating the M pulse widths are obtained according to a calculation method such as a sliding window method, a window changing method or the like.

An average calculation of pieces of sample data will be described below by using the number M of pieces of sample data, a pulse width $\tau_i$ indicated by each piece of sample data, an average $A_j$ of the pieces of sample data and a stationary phase difference A.

Figure 10A:
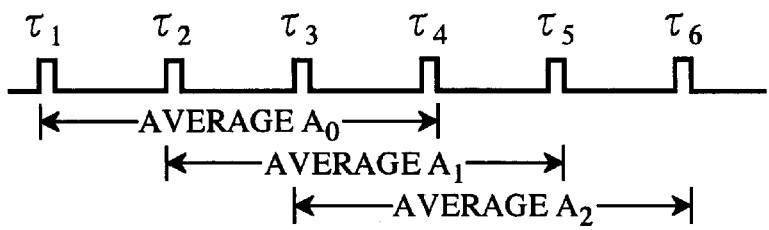
FIG. 10A shows an average calculation of pieces of sample data (pulse widths) according to a sliding window method.
Figure 10B:
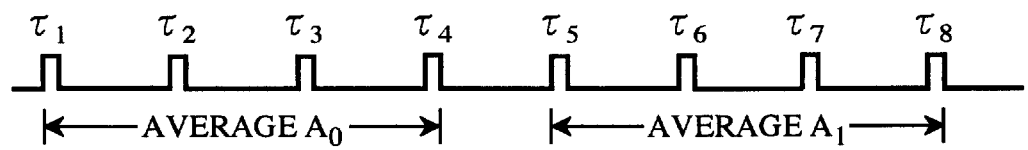
FIG. 10B shows an average calculation of pieces of sample data (pulse widths) according to a window changing method.
Figure 10C:
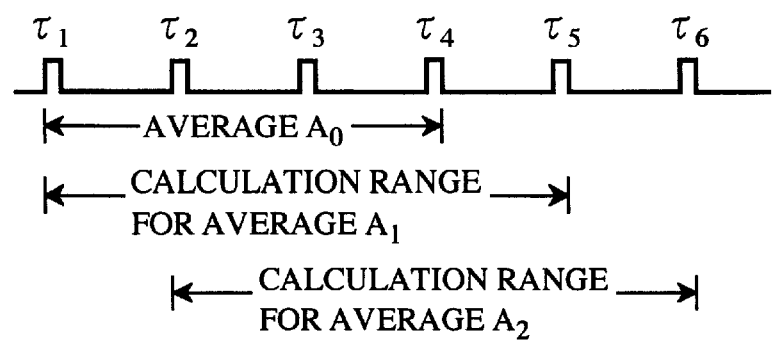
FIG. 10C shows an average calculation of pieces of sample data (pulse widths) according to a modification of the sliding window method.
Figure 11:
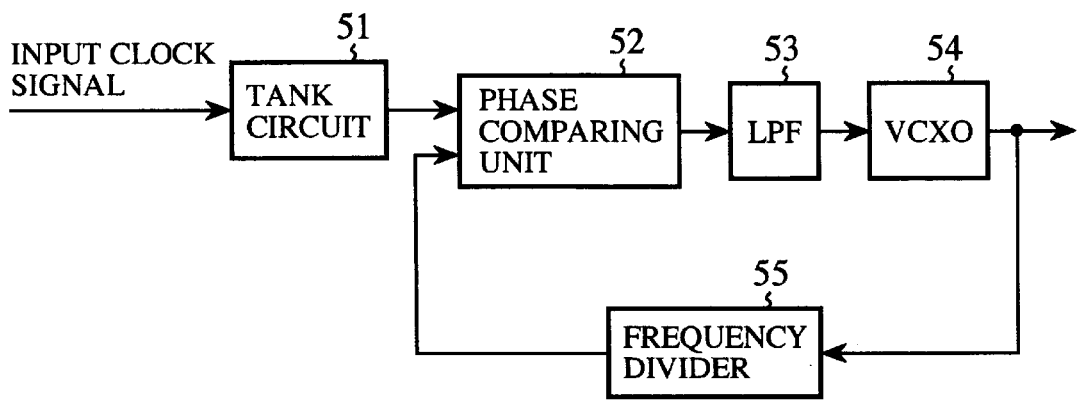
FIG. 11 is a block diagram of a first conventional phase-locked loop circuit.

FIG. 10A shows an average calculation of pieces of sample data according to the sliding window method, FIG. 10B shows an average calculation of pieces of sample data according to the window changing method, and FIG. 10C shows an average calculation of pieces of sample data according to a modification of the sliding window method.

(1) Sliding window method $$(\tau_1+\tau_2+\ldots+\tau_M)/M=A_0$$

$$(\tau_1+\tau_2+\tau_3+\ldots+\tau_{M+1}-A_0)/M=A_1$$

This sliding window method is shown in FIG. 10A. As shown in FIG. 10A, a window area (or a calculation time period) of M pieces of sample data is slid by one pulse for each average $A_j$. Therefore, each pair of window areas corresponding to two averages consecutively calculated overlap with each other.

A method of determining the stationary phase difference A by using a plurality of averages $A_j$ obtained according to the sliding window method will be described below.

(1-1) The average $A_0$ first obtained is set as a stationary phase difference A, and the stationary phase difference A is renewed in cases where the average is changed.

$$A=A_0$$

$$A_0 \neq A_1 \rightarrow A=A_1$$

(1-2) In cases where N averages consecutively determined agree with each other, an average of the N (for example N=3) averages is set as a stationary phase difference A.

$$\therefore A=(A_1+A_2+A_3)/3$$

(2) Window changing method $$(\tau_1+\tau_2+ \ldots +\tau_M)/M=A_0$$

$$(\tau_{M+1}+\tau_{M+2}+ \ldots +\tau_{2M})/M=A_1$$

$$(\tau_{2M+1}+\tau_{2M+2}+ \ldots +\tau_{3M})/M=A_2$$

This window changing method is shown in FIG. 10B. As shown in FIG. 10B, each pair of window areas (or calculation time periods) of the averages do not overlap with each other, and pieces of sample data corresponding to each average differ from those of the other averages.

A method of determining the stationary phase difference A by using a plurality of averages $A_j$ obtained according to the window changing method will be described below.

(2-1) The average $A_0$ first obtained is set as a stationary phase difference A, and the stationary phase difference A is renewed in cases where the average is changed.

$$A=A_{-1}$$

$$A_{-1} \neq A_0 \rightarrow A=A_0$$

(2-2) In cases where N averages consecutively determined agree with each other, an average of the N (for example N=3) averages are respectively regarded as a stationary phase difference A.

$$\therefore A=(A_{-1}+A_0+A_{+1})/3$$

(3) Modification of the sliding window method $$(\tau_1+\tau_2+ \ldots +\tau_M)/M=A_0$$

$$(\tau_1+\tau_2+\tau_3+ \ldots +\tau_{M+1}-A_0)/M=A_1$$

$$(\tau_k+\tau_{k+1}+\tau_{k+2}+ \ldots +\tau_{K+M}-A_{K-1})/M=A_k$$

This modification of the sliding window method is shown in FIG. 10C. As shown in FIG. 10C, a new average $A_k$ is obtained by using an average $A_{K-1}$ previously obtained.

In conclusion, the calculation of the stationary phase difference is performed according to one of following methods.

(Method-1) In cases where widths of N pulses consecutively placed agree with each other, it is regarded that the final pulse width denotes the stationary phase difference.

(Method-2) It is regarded that an average of widths of M consecutive pulses obtained according to the sliding window method denotes the stationary phase difference.

(Method-3) In cases where N consecutive averages of pulse widths obtained according to the sliding window method agree with each other, it is regarded that each of the N averages denotes the stationary phase difference.

(Method-4) It is regarded that an average of M consecutive pulses obtained according to the window changing method denotes the stationary phase difference.

(Method-5) In cases where N consecutive averages of pulse widths obtained according to the window changing method agree with each other, it is regarded that each of the N averages denotes the stationary phase difference.

(Method-6) It is regarded that an average of M consecutive pulses obtained according to the modification of the sliding window method denotes the stationary phase difference.

(Method-7) In cases where N consecutive averages of pulse widths obtained according to the modification of the sliding window method agree with each other, it is regarded that each of the N averages denotes the stationary phase difference.

(Method-8) It is regarded that a width of a pulse obtained before the occurrence of an abnormal condition by a prescribed time period or more denotes the stationary phase difference.

As is described above, in the fifth embodiment, it is regarded that the final pulse width among widths of N consecutive pulses denotes the stationary phase difference in cases where the N pulse widths agree with each other, it is regarded that each of the N consecutive averages of pulse widths denotes the stationary phase difference in cases where the N consecutive averages agree with each other, or it is regarded that an average of widths of M consecutive pulses denotes the stationary phase difference. Therefore, even though a phase error signal Sc based on an external input clock signal Sa set to a phase deteriorating condition due to the occurrence of a fault is sent from the phase comparing unit 1 to the phase difference holding unit 2, the phase error signal Sf2 indicating the stationary phase difference can be held as a phase error signal Sc in the phase difference holding unit 2 so as to prevent the phase error signal Sc of the phase comparing unit 1 from being stored in the phase difference holding unit 2. Accordingly, even though the interruption of the external input clock signal Sa occurs due to the occurrence of an abnormal condition, the reliability of the phase error signal Sc held in the phase difference holding unit 2 can be improved, and a change of frequency due to the occurrence of an abnormal condition can be prevented in the phase-locked loop circuit.

What is claimed is:

1. A phase-locked loop circuit comprising:

a phase comparator for comparing a phase of an input clock signal having a prescribed frequency and a phase of a feed-back signal and outputting a phase error signal indicating a phase difference between the input clock signal and the feed-back signal;

a low pass filter for smoothing the phase error signal to produce a voltage controlled signal;

a voltage controlled oscillator for producing an oscillation clock signal according to the voltage controlled signal produced by the low pass filter and outputting the oscillation clock signal; and a frequency divider for dividing a frequency of the oscillation clock signal produced by the voltage controlled oscillator to produce the feed-back signal output to the phase comparator, characterized in that the phase-locked loop circuit further comprises:

an abnormal condition detector for monitoring a pulse width of the phase error signal output from the phase comparator and judging the input clock signal to be in an abnormal condition in a case where the pulse width of the phase error signal exceeds a prescribed threshold value;

a phase difference storage for storing the phase error signal output from the phase comparator;

a selector for selecting either the phase error signal output from the phase comparator or the phase error signal stored in the phase difference storage and outputting the selected phase error signal to the low pass filter; and a control unit for controlling the selector to select the phase error signal stored in the phase difference storage in a case where it is judged by the abnormal condition detector that the input clock signal is in an abnormal condition.

2. A phase-locked loop circuit according to claim 1, wherein sample data is extracted from the phase error signal by the phase difference storage in synchronization with a sampling clock signal, and the sampling clock signal is obtained from the voltage controlled oscillator.

3. A phase-locked loop circuit according to claim 1, wherein sample data is extracted from the phase error signal by the phase difference storage in synchronization with a sampling clock signal, and the sampling clock signal is obtained from an external oscillator.

4. A phase-locked loop circuit according to claim 1, further comprising:

a calculator for consecutively extracting a prescribed number of pulses from the phase error signal output from the phase comparator in a case where it is judged by the abnormal condition detector that the input clock signal is in a normal condition and making the phase difference storage store a width of one pulse in a case where widths of the pulses of the phase error signal agree with each other.

5. A phase-locked loop circuit according to claim 1, further comprising:

a calculator for extracting a prescribed number of pulses from the phase error signal output from the phase comparator in a case where it is judged by the abnormal condition detector that the input clock signal is in a normal condition, performing a calculation operation for widths of the pulses of the phase error signal and making the phase difference storage store an average of the widths of the pulses of the phase error signal.

6. A phase-locked loop circuit according to claim 5, wherein the average of the widths is calculated in the calculator each time a prescribed number of pulses are extracted from the phase error signal in a time period, each pair of time periods corresponding to two averages consecutively calculated overlap with each other, and one average stored in the phase difference storage as the phase error signal is replaced with the other average most recently calculated among the averages.

7. A phase-locked loop circuit according to claim 5, wherein the average of the widths is calculated in the calculator each time a prescribed number of pulses are extracted from the phase error signal in a time period, each pair of time periods corresponding to two averages consecutively calculated overlap with each other, and one average stored in the phase difference storage as the phase error signal is replaced with another average of a prescribed number of averages consecutively calculated in a case where the averages agree with each other.

8. A phase-locked loop circuit according to claim 5, wherein the average of the widths is calculated in the calculator each time a prescribed number of pulses are extracted from the phase error signal in a time period, each pair of time periods corresponding to two averages do not overlap with each other, and one average stored in the phase difference storage as the phase error signal is replaced with the other average most recently calculated among the averages.

9. A phase-locked loop circuit according to claim 5, wherein the average of the widths is calculated in the calculator each time a prescribed number of pulses are extracted from the phase error signal in a time period, each pair of time periods corresponding to two averages do not overlap with each other, and one average stored in the phase difference storage as the phase error signal is replaced with another average of a prescribed number of averages consecutively calculated in a case where the averages agree with each other.

10. A phase-locked loop circuit according to claim 1, wherein the feed-back signal is loaded by the frequency divider according to an edge of the input clock signal, in a case where it is judged by the abnormal condition detector that the input clock signal is in the abnormal condition, to make a phase of the feed-back signal approach to that of the input clock signal.

11. A phase-locked loop circuit according to claim 1, wherein a load point is determined by the frequency divider according to an edge of the input clock signal in a case where it is judged by the abnormal condition detector that the input clock signal is in the abnormal condition, and the feed-back signal is loaded with a value of the phase error signal stored in the phase difference storage at the load point by the frequency divider to make a phase of the feed-back signal approach to that of the input clock signal.

* * * * *